United States Patent [19]

Shima

[11] Patent Number: 5,028,562
[45] Date of Patent: Jul. 2, 1991

[54] METHOD FOR PRODUCING A SEMICONDUCTOR LASER USING SELECTIVE EPITAXY

[75] Inventor: Akihiro Shima, Itami, Japan

[73] Assignee: Mitsubishi Denki Kabushiki Kaisha, Tokyo, Japan

[21] Appl. No.: 537,604

[22] Filed: Jun. 14, 1990

Related U.S. Application Data

[62] Division of Ser. No. 310,370, Feb. 13, 1989, Pat. No. 4,951,289.

[30] Foreign Application Priority Data

Feb. 26, 1988 [JP] Japan ................................ 63-45612

[51] Int. Cl.$^5$ ................... H01L 21/20; H01L 21/205
[52] U.S. Cl. .......................... 437/90; 148/DIG. 26; 148/DIG. 95; 437/133; 437/129
[58] Field of Search ................... 148/DIG. 26, 25, 29, 148/56, 65, 72, 50, 95, 110, 169; 156/610–614, 647, 653, 662; 357/16, 17; 427/248.1, 255.5; 372/44–46, 48; 437/81, 89, 90, 99, 107, 108, 110, 126, 129, 133, 936, 970

[56] References Cited

U.S. PATENT DOCUMENTS

| | | | |
|---|---|---|---|
| 4,532,694 | 8/1985 | Kolbas | 437/133 |
| 4,595,454 | 6/1986 | Dautremont-Smith et al. | 437/129 |
| 4,631,802 | 12/1986 | Hayashi et al. | 437/89 |
| 4,652,077 | 3/1987 | Erman et al. | 357/60 |
| 4,788,159 | 11/1988 | Smith | 437/133 |
| 4,852,111 | 7/1989 | Hayakawa et al. | 372/46 |
| 4,920,069 | 4/1990 | Fossum et al. | 437/90 |
| 4,933,302 | 6/1990 | Costrini et al. | 437/129 |
| 4,950,622 | 8/1990 | Kwon et al. | 437/129 |

FOREIGN PATENT DOCUMENTS

| | | |
|---|---|---|
| 0095895 | 5/1982 | European Pat. Off. . |
| 0026062 | 3/1984 | European Pat. Off. . |
| 0198656 | 4/1985 | European Pat. Off. . |
| 0076890 | 6/1977 | Japan ................................ 437/133 |
| 0086790 | 5/1983 | Japan ................................ 437/89 |
| 0102086 | 5/1986 | Japan ................................ 372/46 |

OTHER PUBLICATIONS

"Visible GaAlAs V-Channeled Substrate Inner Strip Laser with Stabilized Mode Using p-GaAs Substrate", Yamamoto et al., App. Phy. Lett. 40(5), 03/01/82, pp. 372–374.

"Very Low Threshold Buried-VSIS Lasers," Yamamoto et al., pp. 69–74.

Primary Examiner—Olik Chaudhuri
Assistant Examiner—William D. Bunch
Attorney, Agent, or Firm—Leydig, Voit & Mayer

[57] ABSTRACT

A semiconductor laser includes, serially disposed, a semiconductor substrate of a first conductivity type, a semiconductor current blocking layer of a second conductivity type opposite the first conductivity tyupe, a first semiconductor cladding layer of the first conductivity type, an active semiconductor layer, a second semiconductor cladding layer of the second conductivity type, and a semiconductor contacting layer of the second conductivity type, and a structure for laterally confining the transverse flow of electrical current through the layers, the structure including a portion of the first cladding layer being disposed in a longitudinal groove extending through the current blocking layer into the substrate and high resistance longitudinal stripes disposed adjacent the groove between the second cladding layer and the current blocking layer, the high resistance stripes forming discontinuities in the active semiconductor layer.

8 Claims, 3 Drawing Sheets

METHOD FOR PRODUCING A SEMICONDUCTOR LASER USING SELECTIVE EPITAXY

This is a division of application Ser. No. 310,370 filed Feb. 13, 1989, now U.S. Pat. No. 4,951,289.

FIELD OF THE INVENTION

The present invention relates to a semiconductor laser and a method for producing that laser and, more particularly, to semiconductor lasers which achieve an internal current confinement structure by use of a grooved current blocking layer.

BACKGROUND OF THE INVENTION

Various semiconductor laser structures have been devised and realized. An important characteristic for a semiconductor laser is its threshold current. When currents exceeding that threshold pass through a laser, laser oscillation and emission of coherent radiation can be expected. High threshold current, however, tends to reduce the laser lifetime. In order to reduce the threshold current to a minimum value, many semiconductor laser structures employ a current concentration means. The current concentration means generally constricts current flow to a localized area within the laser, reducing the total current flow needed to reach the threshold current density in the localized area. Inclusion of current concentration means can increase the complexity of the structure of the laser, its manufacturing process, and its cost.

A cross-sectional, perspective, and schematic view of a known laser structure including current confinement means is shown in FIG. 3. That v-channeled substrate inner stripe (VSIS) laser is described in Volume 40 of *Applied Physics Letters*, pages 372-374 (1982). In the conventional laser of FIG. 3, a p-type GaAs substrate 1 has disposed on it an n-type GaAs current blocking layer 2. A p-type lower cladding layer 3 of $Al_yGa_{1-y}As$ is disposed on current blocking layer 2. A p-type $Al_xGa_{1-x}As$ active layer 4 is disposed on lower cladding layer 3. An n-type $Al_yGa_{1-y}As$ upper cladding layer 5 is disposed on active layer 4. In a typical laser structure according to FIG. 3, x is approximately 0.15 and y is approximately 0.49. An n-type GaAs contacting layer 6 is disposed on upper cladding layer 5. Electrodes 11 and 12 are disposed on the exposed surfaces of substrate 1 and contacting layer 6, respectively.

The laser structure of FIG. 3 includes a v-shaped longitudinal groove 13 that extends along the length of substrate 1, generally parallel to the interfaces between semiconductor layers, and confines current flowing through the laser (i.e., from one electrode to the other) to the central stripe region defined by the groove 13. Groove 13 extends generally normal to the interfaces between semiconductor layers, through current blocking layer 2 and into substrate 1. Groove 13 is filled with a portion of lower cladding layer 3 so that cladding layer 3 is the only substantially non-planar layer in the structure.

The VSIS laser of FIG. 3 can be manufactured with only two crystalline growth steps. In the initial growth step, current blocking layer 2 is grown on substrate 1. That structure is removed from the crystalline growing apparatus and groove 13 is formed in blocking layer 2 and substrate 1 by conventional photolithography and chemical etching techniques. After the formation of groove 13, the second crystalline growth step is carried out. AlGaAs layers 3, 4, and 5 and GaAs contacting layer 6 are successively grown, preferably by liquid phase epitaxy (LPE). Deposition of electrodes 11 and 12 complete manufacture of the laser structure. Thus, the manufacturing process is relatively simple.

When the laser of FIG. 3 is properly biased so that an electric current flows between electrodes 11 and 12, much of the potential current flow is blocked by the reverse biased pn junction formed between current blocking layer 2 and first cladding layer 3. However, current can easily flow through groove 13 since at the area of its penetration of substrate 1 no rectifying junction is present. Typically, groove 13 is three to five microns wide where it penetrates substrate 1.

As indicated by the arrows in FIG. 3, the current flowing from substrate 1 through groove 13 spreads laterally in the groove and into layer 3. The component of the current flowing toward electrode 12 largely contributes to laser oscillation and the production of light. However, that portion of the current that flows laterally in layer 3 from groove 13, i.e., the reactive current, does not contribute to laser oscillation. Likewise, the lateral flow of charge carriers in active layer 4 opposite groove 13 does not contribute to laser oscillation and increases the reactive current component of the current flow. Because of the portion of the total current that is lost to reactive current flow, the threshold current of a laser of the type shown in FIG. 3 is relatively high, e.g., 35 to 45 milliamps.

Another conventional laser structure employing current confinement means is shown in a perspective, schematic, cross-sectional view in FIG. 4. In the buried v-channel substrate inner stripe (B-VSIS) laser structure of FIG. 4, the current confinement means of FIG. 3 is supplemented to suppress reactive current flow. As in all figures, like elements of FIGS. 3 and 4 are given the same reference numerals. In addition to the elements previously described for FIG. 3, the structure of FIG. 4 includes an n-type GaAs cap layer 7 disposed opposite groove 13 and a relatively high resistance $Al_zGa_{1-z}As$ buried layer 8 disposed on current blocking layer 2. A second buried layer 9 of p-type $Al_uGa_{1-u}As$ is disposed on layer 8 adjacent contacting layer 6. In a typical structure, z is approximately 0.8 and u is approximately 0.2. High resistance layer 8 is disposed at opposite sides of groove 13 to suppress the lateral flow of charge carriers from groove 13.

The production process for the laser structure of FIG. 4 is more complicated than that of FIG. 3 and requires three crystalline growth steps. In an initial crystalline growth step, current blocking layer 2 is deposited on the substrate 1. Thereafter, as described for the structure of FIG. 3, groove 13 is formed by conventional photolithography and etching steps. In the second crystalline growth step, lower cladding layer 3, active layer 4, upper cladding layer 5, and cap layer 7 are successively deposited, preferably by LPE. In order to shape the resulting structure for the growth of layers 8 and 9, conventional photolithography and etching techniques are employed to remove portions of layers 3, 4, 5, and 7. That removal results in the formation of a longitudinal mesa as would be indicated in FIG. 4 if layers 8, 9, and 6 were absent. In the third crystalline growth step, high resistance AlGaAs layer 8, p-type AlGaAs layer 9, and contact layer 6 are successively grown. As before, electrodes 11 and 12 are then deposited by conventional techniques to complete the structure.

When a current flows through the laser structure of FIG. 4, lateral current flow in layers 3, 4, 5, and 7 is suppressed by layers 8 and 9. Reactive current flow in the active layer 4 that does not contribute to laser oscillation is thereby reduced and the threshold current of the laser is reduced to about 20 to 25 milliamps.

While the structure of FIG. 4 achieves a significant reduction in threshold current, the complexity of the manufacturing techniques required significantly increases costs. Three crystalline growing steps are required as compared to two in the structure of FIG. 3. The mesa formation between the second and third crystalline growth steps requires high precision in photolithography and etching. Moreover, the regrowth interfaces between the longitudinal sides of the mesa, particularly layer 4, and layers 8 and 9 that are formed at the sides of the mesa, i.e., the laser oscillation region, are inherently weak and result in reduced laser lifetime.

SUMMARY OF THE INVENTION

Accordingly, a general aim of the present invention is the provision of a laser structure including a current confinement means that is relatively simple and inexpensive to manufacture and that produces a laser having a relatively low current threshold and an extended lifetime.

Other objects and advantages of the present invention will become apparent from the detailed description given hereinafter. It should be understood, however, that the detailed description and specific embodiments are given by way of illustration only, since various changes and modifications within the spirit and scope of the invention will become apparent to those skilled in the art from this detailed description.

In one aspect of the invention, a current confinement means in a semiconductor laser includes a v-shaped longitudinal groove extending through the current blocking layer into the substrate. Relatively high resistance longitudinal stripes are disposed on the current blocking layer adjacent the longitudinal edges of the groove. The first cladding layer is disposed in the groove and elsewhere on the current blocking layer but the high resistance longitudinal stripes prevent growth of the lower cladding layer on their surface. The active semiconductor layer is also discontinuous, covering the first cladding layer, but not the high resistance stripes. A second cladding layer is disposed on the discontinuous active layer and on the intervening high resistance stripes.

The high resistance stripes and the laterally discontinuous active layer suppress lateral current flow to reduce laser oscillation threshold current, reducing power dissipation and extending the lifetime of the laser.

In another aspect of the invention, the laser structure is manufactured by successively growing the current blocking and high resistance semiconductor layers on a substrate in a first crystalline growth step. The high resistance layer inhibits the subsequent growth of a semiconductor layer on it. A limited area of the high resistance semiconductor layer is defined and a longitudinal v-shaped groove extending through the high resistance layer and the current blocking layer into the substrate is formed. The high resistance layer is thereby defined as longitudinal stripes lying at the longitudinal edges of the v-shaped groove. The semiconductor laser structure is completed in a second crystalline growth step in which the remaining semiconductor layers are successively grown. A laterally discontinuous first cladding layer is selectively grown in the v-shaped groove and on the current blocking layer adjacent the high resistance stripes. A laterally discontinuous active semiconductor layer is selectively grown on the first cladding layer and in contact with, but not covering, the high resistance longitudinal stripes. A relatively thick second cladding layer is grown on the longitudinal stripes of the discontinuous active semiconductor layer and covering the intervening, exposed surfaces of the high resistance semiconductor material.

The high resistance semiconductor material may be a semiconductor that has a surface that is easily oxidized, provided the oxidized surface discourages nucleation and growth of a crystalline layer on it. AlGaAs is an example of an easily oxidized semiconductor that can be used for the high resistance stripes. Alternatively, electrical insulators can be employed provided the insulators discourage crystalline nucleation.

The method of manufacture of the semiconductor laser according to the invention includes only two crystalline growth steps, neither of which requires a high precision mask alignment. Therefore, the method of producing a laser according to the present invention is relatively inexpensive.

DETAILED DESCRIPTION OF PREFERRED EMBODIMENTS

Figure 1:
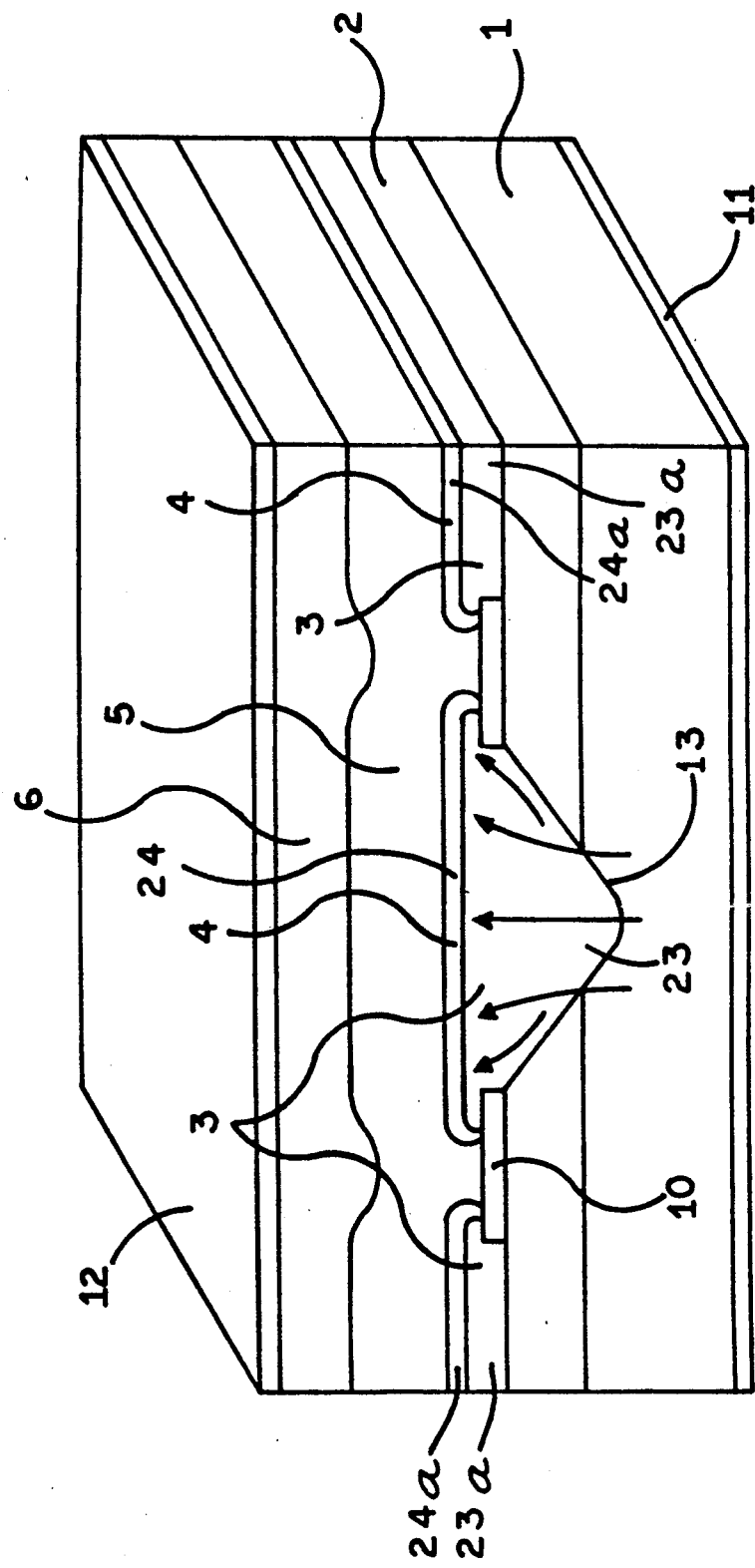
FIG. 1 is a schematic, sectional, perspective view of a semiconductor laser structure according to an embodiment of the present invention.
Figure 3:
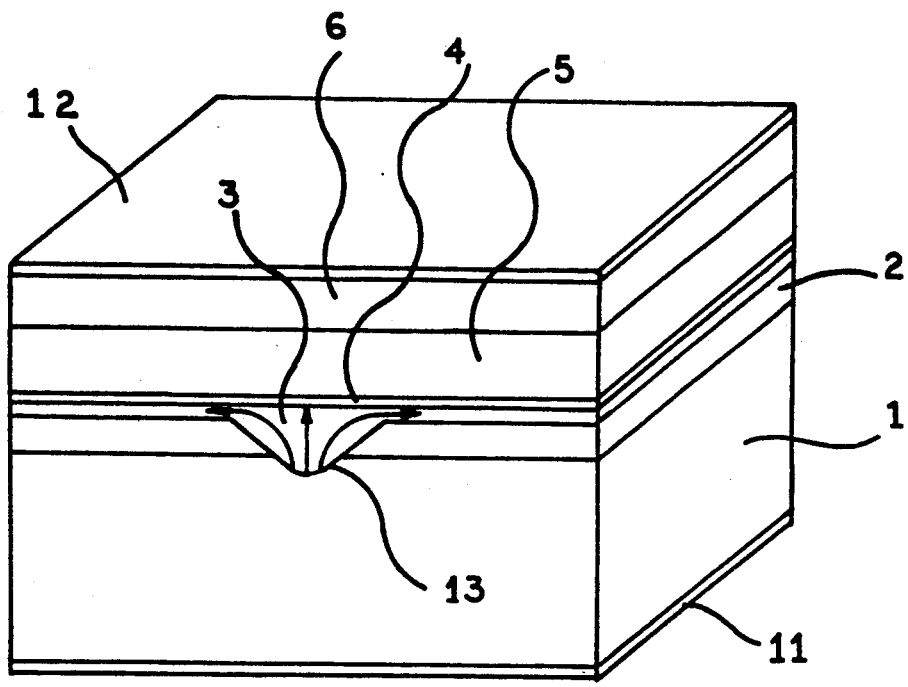
FIG. 3 is a schematic, sectional, perspective view of a conventional VSIS laser structure.
Figure 4:
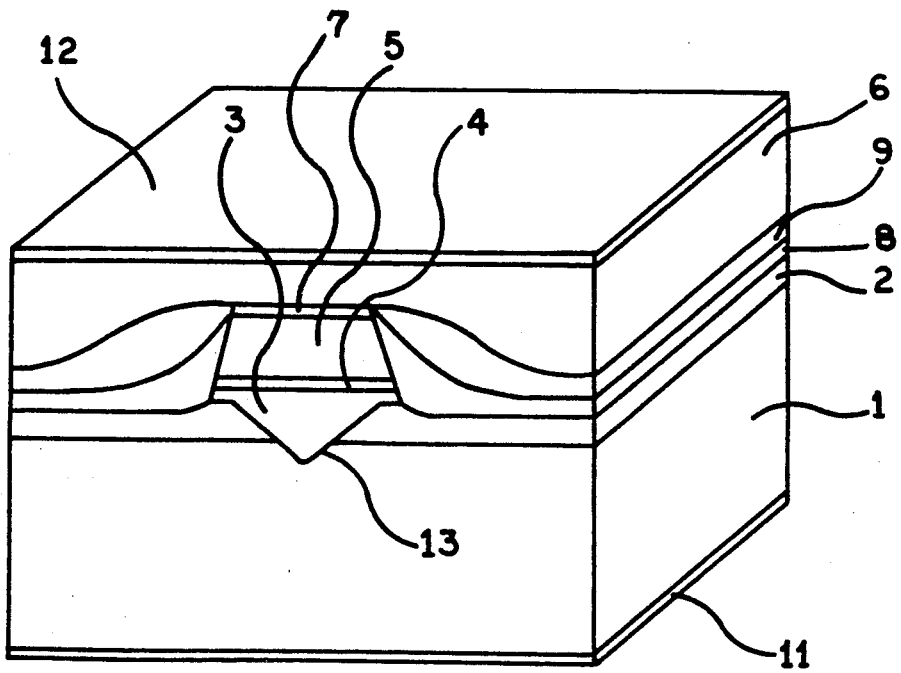
FIG. 4 is a schematic, sectional, perspective view of a conventional B-VSIS laser structure.

In FIG. 1, an embodiment of a structure of a semiconductor laser according to the invention is shown in a schematic, perspective view. Elements that are identical or correspond to like elements in FIGS. 3 and 4 are given the same reference numerals. In a specific embodiment, substrate 1 is p-type GaAs and current blocking layer 2 is n-type GaAs.

The structure of FIG. 1 includes current confinement means in the form of a longitudinal groove 13 extending through current blocking layer 2 into substrate 1. Unlike the continuous lower cladding layer of FIGS. 3 and 4, the structure of FIG. 1 includes a laterally discontinuous cladding layer 3. As shown in FIG. 1, cladding layer 3, here p-type AlGaAs, fills longitudinal v-shaped groove 13 in a central stripe 23, and also is disposed in two peripheral regions 23a covering current blocking layer 2. The two peripheral regions 23a of the lower cladding layer are separated from the cladding layer in groove 13 by longitudinal stripes 10 of a relatively high resistance material having a surface that resists nucleation of crystalline semiconductor materials on it. In a specific embodiment, high resistance semiconductor stripes 10 may be $Al_vGa_{1-v}As$, where v is approximately 0.8. As indicated in FIG. 1, stripes 10 lie at the edges of groove 13 on the upper surface of current blocking layer 2.

Like lower cladding layer 3, active semiconductor layer 4, here preferably undoped or p-type AlGaAs, is laterally discontinuous and consists of three regions—central stripe 24 and peripheral regions 24a. Each of the regions of the active semiconductor layer is disposed on a corresponding region of the lower cladding semiconductor, and the layer is discontinuous at locations opposite high resistance semiconductor stripes 10. The discontinuities, particularly the discontinuity in the active layer 4, function as current leakage reduction means and serve to suppress lateral current flow from the central stripe. The second cladding layer 5, which is relatively thick compared to the thicknesses of lower cladding layer 3 and active layer 4, is disposed on the active semiconductor layer 4 add also covers the high resistance semiconductor stripes 10. In the specific embodiment being described, the upper cladding layer is n-type AlGaAs. Finally, a contacting layer 6 is disposed on upper cladding layer 5 to complete the semiconductor part of the laser structure. Electrodes 11 and 12 are disposed on opposite sides of the laser structure.

When an electrical signal of the appropriate polarity is applied across electrodes 11 and 12, a current flows through the layers that are serially disposed in the structure. Because of the rectifying junction formed between layers 2 and 3, that current is confined to flow through the lower cladding layer that is disposed in longitudinal groove 13. In the structure of FIG. 1, lateral spreading of that current is inhibited by the relatively high resistance of longitudinal stripes 10 which are interposed between the central stripe 24 in the active layer which is being excited, and the peripheral regions 24a which are not. In addition, the energy bandgap of stripes 10 is preferably chosen to be larger than that of the other materials in the structure. The energy bandgap change from active layer material to the stripe 10 material adds an additional potential barrier that further inhibits lateral spreading of the current flowing in the laser structure.

All of these elements restricting lateral current flow reduce the proportion of the input current that becomes reactive current, i.e., does not contribute to laser oscillation. As a result, the laser oscillation threshold current of the structure of FIG. 1 is substantially reduced compared to the thresholds of known v-shaped groove lasers having simple structures. For example, the threshold current of the structure of FIG. 1 is only about twenty milliamps. Since most of the radiative charge carrier recombination is constrained to take place in the part of active layer 4 that is disposed opposite groove 13, i.e., the central stripe 24a, non-radiative recombination in the side of the groove 13 is reduced. The reduced non-radiative recombination decreases the operating temperature of the laser and thereby extends its lifetime.

An important feature in the manufacture of semiconductor lasers according to the invention is the ability to control and inhibit nucleation on high resistance stripes 10 during part of the second crystalline growth step. AlGaAs is a good semiconductor material for high resistance stripes 10. The bandgap of that material can be controlled by controlling the proportion of aluminum included in the layer. In that way, the potential barrier to lateral current flow through stripes 10 can be controlled and enhanced. In addition, as is well known, the surface of AlGaAs, particularly when a high proportion of aluminum is present, can be readily oxidized in air and in oxidizing chemical solutions. When that surface is oxidized, it is difficult to grow crystalline layers directly on it. The oxide discourages the nucleation that is essential for good selective epitaxial growth. This property of the oxidized surface is exploited in a preferred method of manufacturing the structure of FIG. 1. To obtain the desired nucleation characteristic, the aluminum to gallium ratio should be at least two to three in stripes 10. While oxidation of the surface of the high resistance semiconductor stripes 10 is emphasized in this description, any semiconductor that can have a relatively high resistance and that has a surface that discourages epitaxial growth can be used to form stripes 10.

Figure 2A:
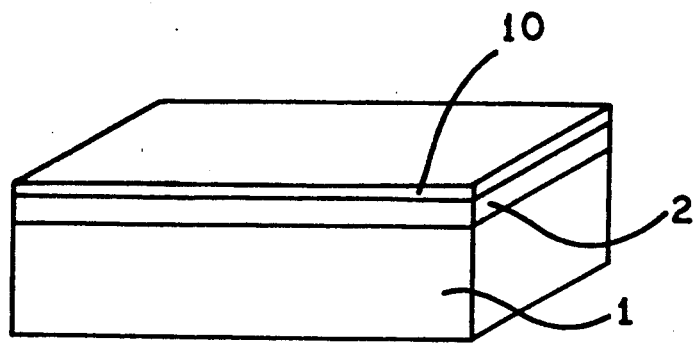
FIGS. 2(a)–2(d) are sectional, perspective views of steps illustrating a method of manufacturing a semiconductor laser structure according to the invention.

FIGS. 2(a)–2(d) illustrate the steps in a preferred method of manufacturing the laser structure of FIG. 1. The preferred method includes only two crystalline growth steps, the second step being employed to grow several semiconductor layers sequentially. FIG. 2(a) illustrates the first crystalline growth step. A current blocking layer 2 of a conductivity type opposite that of substrate 1 is grown. Subsequently, a relatively high resistance semiconductor layer 10 is grown to complete the first crystalline growth step. Either LPE or vapor phase epitaxy may be employed to grow layers 2 and 10.

Figure 2B:
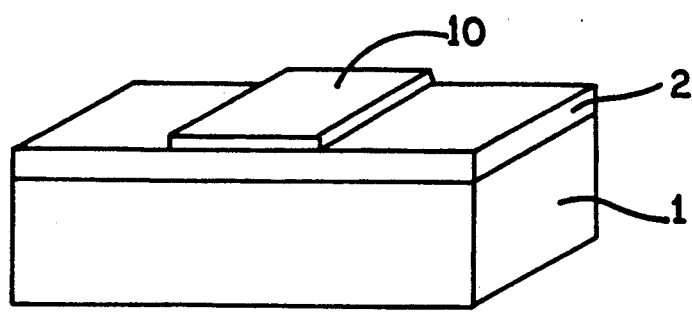

As illustrated in FIG. 2(b), a portion of high resistance layer 10 is removed by conventional photolithography and etching techniques. In a second masking and etching step illustrated in FIG. 2(c), a central portion of layer 10 is removed, again using photolithography and etching techniques, to expose the underlying portion of layer 2 and thereby form longitudinal stripes 10. Either at the same time that the central portion of layer 10 is removed or after its removal, groove 13 is formed by chemical etching to extend through layer 2 and into substrate 1. Any mask remaining on stripes 10 is then removed. If, as in a preferred embodiment, stripes 10 are AlGaAs, their exposure to air before, during, or after the etching steps quickly oxidizes the exposed surface naturally.

Figure 2C:
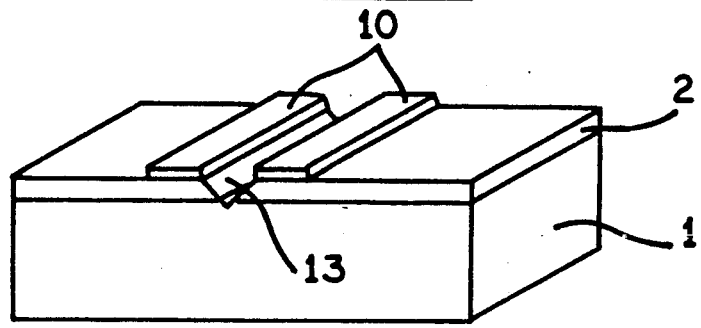
Figure 2D:
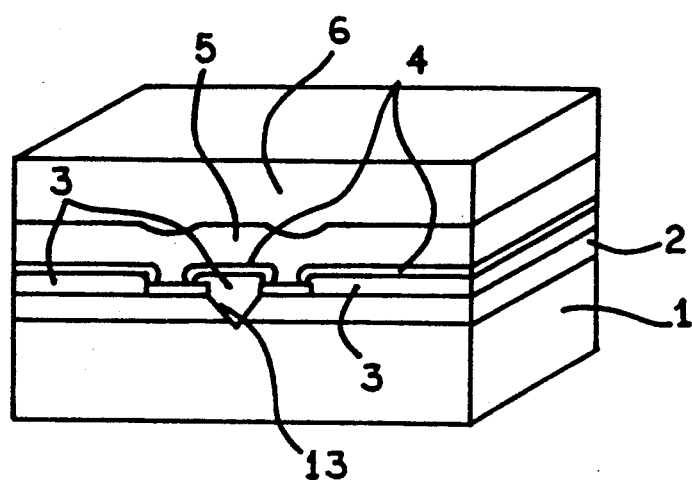

After the completion of the steps indicated in FIG. 2(c), the second crystalline growth process is carried out, as indicated in FIG. 2(d), to grow a series of semiconductor layers sequentially, completing the serially arranged layers that form the laser structure. The oxidized surface of AlGaAs stripes 10 discourages the nucleation of growing crystals and the growth of crystalline layers on it. Accordingly, even in LPE where a liquid directly contacts stripes 10, crystalline growth preferentially begins on surfaces other than on stripes 10. In the second crystalline growth step, the fist or lower cladding layer 3 is preferentially grown in groove 13 and on the exposed surfaces of current blocking layer 2. Because the first cladding layer is quite as thin compared to the width of stripes 10, very little, but some, of it grows on the exposed, oxidized surface of stripes 10. The intervening stripes 10 cause first cladding layer 3 to be laterally discontinuous.

After the growth of cladding layer 3, a relatively thin active layer 4 is grown in the second crystalline growth step. Again, layer 4 does not grow on the exposed oxidized surface of stripes 10. As a result, the active layer is laterally discontinuous at stripes 10, although the edges of layer 4 contact stripes 10. A relatively thick upper cladding layer 5 is then deposited on active layer 4. Layer 5 preferentially is deposited on layer 4 rather than on the oxidized surface of stripes 10. However, layer 5 is typically grown to a thickness of several microns. In the course of that relatively thick growth, some nucleation takes place on stripes 10 and growth proceeds from the sides of the stripes of layer 4. Because of its thickness, layer 5 fills the discontinuous regions of layer 4 opposite stripes 10 during the growth of layer 5. The second crystalline growth is completed with the growth of a contacting layer 6 that assists in making an ohmic contact to the device. Upon completion of the second growth step, electrodes 11 and 12 are applied as indicated in FIG. 1 using conventional metallic alloy evaporation techniques.

The laser structure of FIG. 1 that results from the process illustrated in FIG. 2 is free of any regrowth interfaces in active region, such as appear in the B-VSIS laser of FIG. 4. Since regrowth interfaces in active region are a suspected source of early failure of a laser, the operating lifetime of the structure of FIG. 1 is extended over that of the known B-VSIS lasers. Since only two crystalline growth steps are employed in the method of making the structure of FIG. 1, the production process is no more expensive than that for the structure of FIG. 3 and less than that for the structure of FIG. 4.

In the foregoing description, particular emphasis has been placed on GaAs and AlGaAs materials. However, the present invention can also be employed with other semiconductor lasers, particularly those employing materials such as indium gallium arsenide phosphide. LPE is a particularly desired method of carrying out the crystalline growth steps. In the LPE process, as is well known, layers are grown by supercooling a liquid, which may include a melt, containing the materials to be deposited. By slowly cooling the mixture, semiconductor materials precipitate from the liquid and form the epitaxial layers. In a typical process employing GaAs and AlGaAs, the semiconductor materials are dissolved in a Ga melt at about 780° C. After a molten period of about two hours for equilibrating the solution, the temperature is slowly and methodically reduced. The solution becomes supercooled and gradually the desired solutes are precipitated from the solution to grow semiconductor films.

In a typical structure according to the invention, current blocking layer 2 may be about one micron thick and high resistance stripes 10 may be about 0.1 micron in thickness. First cladding layer 3 may be about 0.1 to about 0.5 micron in thickness with a preferred thickness of about 0.2 micron. Active layer 4 is very thin, preferably about 0.1 micron, but can range from about 0.04 to about 0.15 micron in thickness. Upper cladding layer 5 is made relatively thick to ensure that it fills the spaces between the stripes of active layer 4 over high resistance stripes 10. A typical thickness of upper cladding layer 5 is about 1.5 to about 2 microns.

In the preferred embodiment described, high resistance stripes 10 are AlGaAs. However, other high resistance materials, even non-semiconductors, may be employed as the high resistance stripes. An important characteristic of the material employed is that it discourage nucleation of subsequently deposited crystalline semiconductor material so that the lateral discontinuities in the lower cladding and active layers can be maintained. Examples of other high resistance, even insulating, materials that can be employed as stripes 10 are silicon dioxide and silicon nitride.

When silicon dioxide or silicon nitride are used as high resistance films having the characteristic of discouraging nucleation during crystal growth, the process for producing the laser device is slightly altered. Rather than epitaxially growing an AlGaAs layer as in the process described above, a thin layer of the insulating film is deposited by means such as chemical vapor deposition. This silicon dioxide or silicon nitride insulating film is then patterned photolithographically, much as the AlGaAs film, and etched to produce a structure like that illustrated in FIG. 2c. As with the AlGaAs high resistance stripes, the resulting silicon nitride or silicon dioxide stripes resist nucleation during the second crystal growth phase which forms the remaining layers of the laser device.

When silicon dioxide or silicon nitride are used, in addition to the LPE technique for crystalline growth, metal organic chemical vapor deposition and vapor phase epitaxy techniques can be employed in the second crystalline growth step. AlGaAs is preferred over the insulating materials however, since it has a closer thermal coefficient of expansion match to GaAs series semiconductor compounds than do the insulators.

What is claimed:

1. A method of making a semiconductor laser comprising successively growing on a semiconductor substrate of a first conductivity type, a semiconductor current blocking layer of a second conductivity type opposite said first conductivity type, and a layer of a high resistance material;
   forming a longitudinal groove extending through said high resistance layer, said current blocking layer, and into said substrate;
   exposing regions of the current blocking layer leaving longitudinal stripes of the high resistance material adjacent said groove;
   growing a first semiconductor cladding layer of said first conductivity type in said groove and on the exposed regions of said current blocking layer;
   growing a relatively thin active semiconductor layer on said first cladding layer; and
   growing a second semiconductor cladding layer of said second conductivity type on said active layer and covering said longitudinal strips of high resistance material.

2. The method of claim 1 including inhibiting growth of said first cladding layer and said active layer on said high resistance material by choosing a high resistance material that discourages nucleation during crystalline growth.

3. The method of claim 2 wherein the surface of said high resistance material may be oxidized to discourage nucleation, and including forming said groove by chemical etching and oxidizing the surface of said high resistance material.

4. The method of claim 3 including growing undoped AlGaAs as said high resistance material.

5. The method of claim 1 including depositing one of silicon dioxide and silicon nitride as said high resistance material.

6. The method of claim 1 including growing said second cladding layer to a thickness sufficient to cover the longitudinal stripes of the high resistance material.

7. The method of claim 1 wherein said substrate is p-type GaAs and including growing GaAs as said current blocking layer and AlGaAs as said first and second cladding layers and said active layer.

8. The method of claim 1 including growing said current blocking, first and second cladding, and active layers by one or more of liquid phase epitaxy, metal organic chemical vapor deposition, and vapor phase epitaxy.

* * * * *